United States Patent
Noguchi et al.

(10) Patent No.: US 6,762,564 B2
(45) Date of Patent: Jul. 13, 2004

(54) DISPLAY APPARATUS

(75) Inventors: Yukihiro Noguchi, Motosu-Gun (JP); Shoichiro Matsumoto, Oogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/378,881

(22) Filed: Mar. 5, 2003

(65) Prior Publication Data

US 2003/0168992 A1 Sep. 11, 2003

(30) Foreign Application Priority Data

Mar. 5, 2002 (JP) .......................................... 2002-059557
Jan. 29, 2003 (JP) .......................................... 2003-020588

(51) Int. Cl.$^7$ ................................................. G09G 3/10
(52) U.S. Cl. ............................ 315/169.1; 315/169.3; 345/76
(58) Field of Search ........................... 315/169.3, 169.4, 315/169.1; 345/76, 77

(56) References Cited

U.S. PATENT DOCUMENTS 6,583,581 B2 * 6/2003 Kaneko et al. .......... 315/169.3

FOREIGN PATENT DOCUMENTS

| JP | 61-138259 | 8/1986 |
|----|-----------|--------|
| JP | 63-250873 | 10/1988 |
| JP | 5-249916 | 9/1993 |
| JP | 08-54836 | 2/1996 |
| JP | 08-129358 | 5/1996 |
| JP | 10-319872 | 12/1998 |
| JP | 11-219146 | 8/1999 |
| JP | 11-260562 | 9/1999 |
| JP | 2002-221903 | 8/2000 |
| JP | 2001-60076 | 3/2001 |
| JP | 2001-282136 | 10/2001 |
| WO | WO98/36407 | 8/1998 |

OTHER PUBLICATIONS

"Al–Mo (Aluminium–Molybdenum)" L.Brewer et al., *Binary Alloy Phase Diagrams* vol. 1 ed. Thaddeus B. Massalski, (Dec. 1980) pp. 133–134.

* cited by examiner

*Primary Examiner*—David Vu
(74) *Attorney, Agent, or Firm*—McDermott Will & Emery LLP

(57) ABSTRACT

An organic EL device is fabricated by a novel method to reduce the decrease or the dispersion of the luminance of the organic EL device caused by the voltage drop. A display apparatus comprises: optical elements; a power supply line which supplies electrical energy to each of the optical elements; and a signal line which transmits a control signal to each of the optical elements. The resistance of the power supply line is lower than the resistance of the signal line. The cross section of the power supply line may be enlarged, or the resistivity of the constitutional material of the power supply line may be lowered to lower the resistance of the power supply line.

20 Claims, 3 Drawing Sheets

DISPLAY APPARATUS

BACKGROUND OF THE INVENTION

1. Field of the Invention

The present invention relates to a display apparatus, and more particularly to a technology for solving a problem of decrease of luminance of a pixel in an active matrix type display apparatus caused by a voltage drop.

2. Description of the Related Art

Organic electroluminescent displays (hereinafter, also referred to as "organic EL displays" or "organic EL panels") are attracting attention as new flat-type displays. In particular, active matrix type organic EL displays having thin film transistors (hereinafter, also referred to as "TFTs") as switching elements are regarded as sweeping out the currently prevailing liquid crystal displays in the near future, and are in a fierce development race for practical application.

Unlike liquid crystal displays, organic EL displays have self-luminous devices. This eliminates the need for a backlight which is indispensable to liquid crystal displays, promising apparatuses of yet lower profile and lighter weight. Moreover, organic EL panels are expected for application as a light emitting devices such as the backlight of liquid crystal displays using a self-luminous characteristic.

The organic EL devices are current driven type optical devices which emit light by a current flow, so that the current continues flowing the organic EL device during making the organic EL device emit for display. At this time, the luminance of the organic EL device may sometimes decrease caused by a voltage drop of a power supply line which supplies the current to the organic EL device. In the active matrix type organic EL display apparatus, even if the same luminance data is set to the pixels, the luminance of the pixels sometimes disperse by the influence of the voltage drop, as may degrade the display apparatus.

SUMMARY OF THE INVENTION

The present invention has been made in view of the foregoing circumstances and an object thereof is to provide a technology for improving decrease of luminance of a pixel in a display apparatus.

A preferred embodiment according to the present invention relates to a display apparatus. This display apparatus comprises: a plurality of optical elements; a power supply line which supplies electrical energy to each of the optical elements; and a signal line which transmits a control signal to each of the optical elements, wherein a resistance of the power supply line is lower than a resistance of the signal line. Thereby, the decrease or the dispersion of the luminance of the optical elements caused by the voltage drop can be improved.

A cross section of the power supply line may be larger than a cross section of the signal line. Thereby, the resistance of the power supply line can be lowered. A width of the power supply line may be wider than a width of the signal line. A thickness of the power supply line may be thicker than a thickness of the signal line. The cross section of the power supply line can be enlarged without lessening the aperture area of the optical element, by thickening the thickness of the power supply line. A resistivity of a constitutional material of the power supply line may be lower than a resistivity of a constitutional material of the signal line.

The signal line may be a data line which transmits luminance data for controlling each of the optical elements. The signal line may be a scanning line which transmits scan signals for controlling a display timing of each of the optical elements. The data line and the scanning line transmits the voltage signal to each optical element, but the current does not flow through these wires in a steady state, so that the influence of the voltage drop is small. Thus, the aperture area of the optical element can be improved by lessening the cross section of the data line and the scanning line.

It is to be noted that any arbitrary combination or recombination of the above-described structural components and expressions changed between a method, an apparatus, a system and so forth are all effective as and encompassed by the present embodiments.

Moreover, this summary of the invention does not necessarily describe all necessary features, so that the invention may also be sub-combination of these described features.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

First Embodiment

Figure 1:
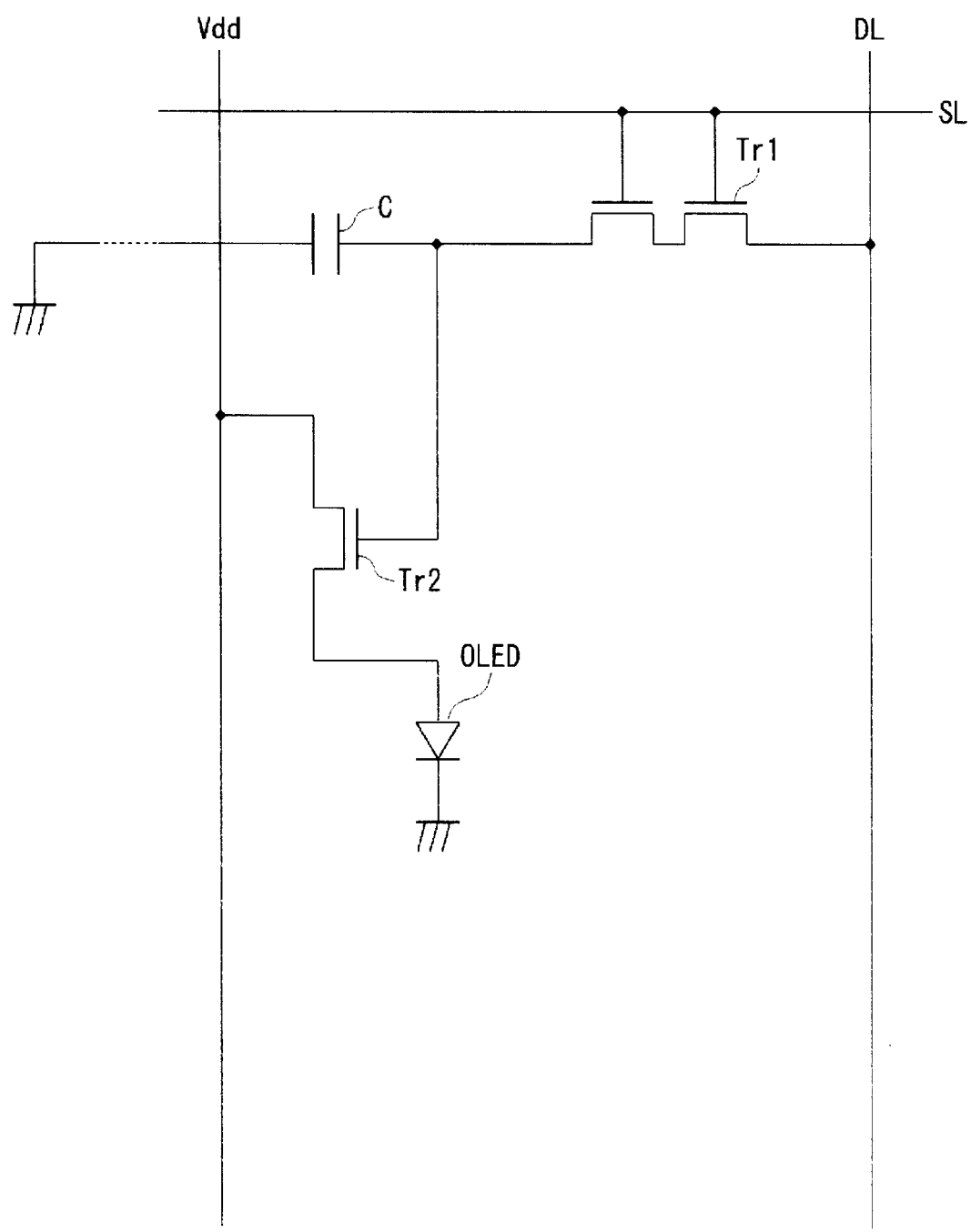
FIG. 1 shows a circuit structure of a single pixel of a display apparatus according to an embodiment.

FIG. 1 shows a circuit structure of a single pixel of a display apparatus 100 according to an embodiment. This circuit comprises an organic light emitting element OLED, two transistors Tr1 and Tr2 for controlling the organic light emitting element OLED, a capacitor C, a scanning line SL which transmits scan signals, a data line DL which transmits luminance data, and a power supply line Vdd which supplies a current to the organic light emitting element OLED.

The power supply line Vdd supplies an electric current for making the organic light emitting element OLED emit. The data line DL transmits luminance data for controlling luminance of each of the organic light emitting elements OLED. The scanning line SL transmits scan signals for controlling the emitting timing of each of the organic light emitting elements OLED.

A gate electrode of a first transistor Tr1 (hereinafter also referred to as "switching transistor") is connected to the scanning line SL. A drain electrode (or a source electrode) of the switching transistor Tr1 is connected to the data line DL. A source electrode (or a drain electrode) of the switching transistor Tr1 is connected to a gate electrode of a second transistor Tr2 (hereinafter also referred to as "driving transistor"). In this embodiment, the switching transistor is a double-gate transistor having two gate electrodes. In another embodiment, the switching transistor may be a single-gate transistor or a multi-gate transistor having three or more gate electrodes. The switching transistor Tr1 may be an n-channel transistor or a p-channel transistor.

A source electrode (or a drain electrode) of the driving transistor Tr2 is connected to an anode of the organic light emitting element OLED. A drain electrode (or a source electrode) of the driving transistor Tr2 is connected to the power supply line Vdd. Similar to the switching transistor Tr1, the driving transistor Tr2 may be a single-gate transistor or a multi-gate transistor, and may be an n-channel transistor or a p-channel transistor.

An anode of the organic light emitting element OLED is connected to the source electrode (or the drain electrode) of the driving transistor Tr2. A cathode of the organic light emitting element OLED is connected to ground potential. An electrode of the capacitor C is connected to the drain electrode (or the source electrode) of the switching transistor Tr1 and the gate electrode of the driving transistor Tr2. Another electrode of the capacitor C is connected to ground potential via a wire not shown in figures, or may be connected to the power supply line Vdd.

An operation of the circuit structured as described above is explained hereinbelow. As the scan signal of the scanning line SL goes high for writing the luminance data to the organic light emitting element OLED, the switching transistor Tr1 turns on, the luminance data which is being inputted to the data line DL is set in the driving transistor Tr2 and the capacitor C. A current which corresponds to the luminance data thus flows between the source electrode and the drain electrode of the driving transistor Tr2, and this current flows in the organic light emitting element OLED, so that the organic light emitting element OLED emits. When the scan signal of the scanning line SL becomes low, the switching transistor Tr1 turns off, but the gate voltage of the driving transistor Tr2 is maintained, so that the organic light emitting element OLED continues emitting according to the set luminance data.

At the next emitting timing, the scan signal of the scanning line SL becomes high again, the switching transistor Tr1 turns on, then the new luminance data which is inputted to the data line DL is set in the driving transistor Tr2 and the capacitor C. Thereby, the organic light emitting element OLED emits corresponding to the new luminance data.

The current must be supplied continuously to the organic light emitting element OLED throughout emission, because the organic light emitting element OLED emits by a current flow. In the case that the power supply line Vdd supplies the current to a plurality of the organic light emitting elements OLED of the pixels like an active matrix type display apparatus, a voltage drop arises because the current flows in each of the organic light emitting elements OLED. The power supply line Vdd is generally connected to the constant-voltage supply, so that the farther from the constant-voltage supply the pixel exists, the lower voltage is supplied to the organic light emitting element OLED because of the voltage drop. If the voltage applied to the source electrode (or the drain electrode) of the driving transistor Tr2 drops, then the voltage difference between the source electrode and the drain electrode of the driving transistor Tr2 will decrease, the operating point of the organic light emitting element OLED may come away from the saturation region of the driving transistor Tr2, resulting that the current flowing in the organic light emitting element OLED may decrease and the luminance may decrease. In the case that the driving transistor Tr2 is a p-channel transistor, the electrode connected to the power supply line Vdd is the source electrode. In this case, the voltage difference between the gate electrode and the source electrode may not be the same even if the same luminance data is set to the driving transistors Tr2 and applied the same voltage to the gate electrodes of the driving transistors Tr2, because the pixel farther from the constant-voltage supply is applied lower voltage to the source electrode because of the voltage drop, so that the luminance of the organic light emitting elements OLED may not be the same and the dispersion of the luminance may arise. It is easily imaginable that the luminance decrease and dispersion may become more conspicuous when the display apparatus enlarges and more pixels are arrayed in a matrix form. It is very important for enlarging the display size and heightening the luminance of the display apparatus to improve the decrease and the dispersion of the luminance caused by the voltage drop.

Figure 2:
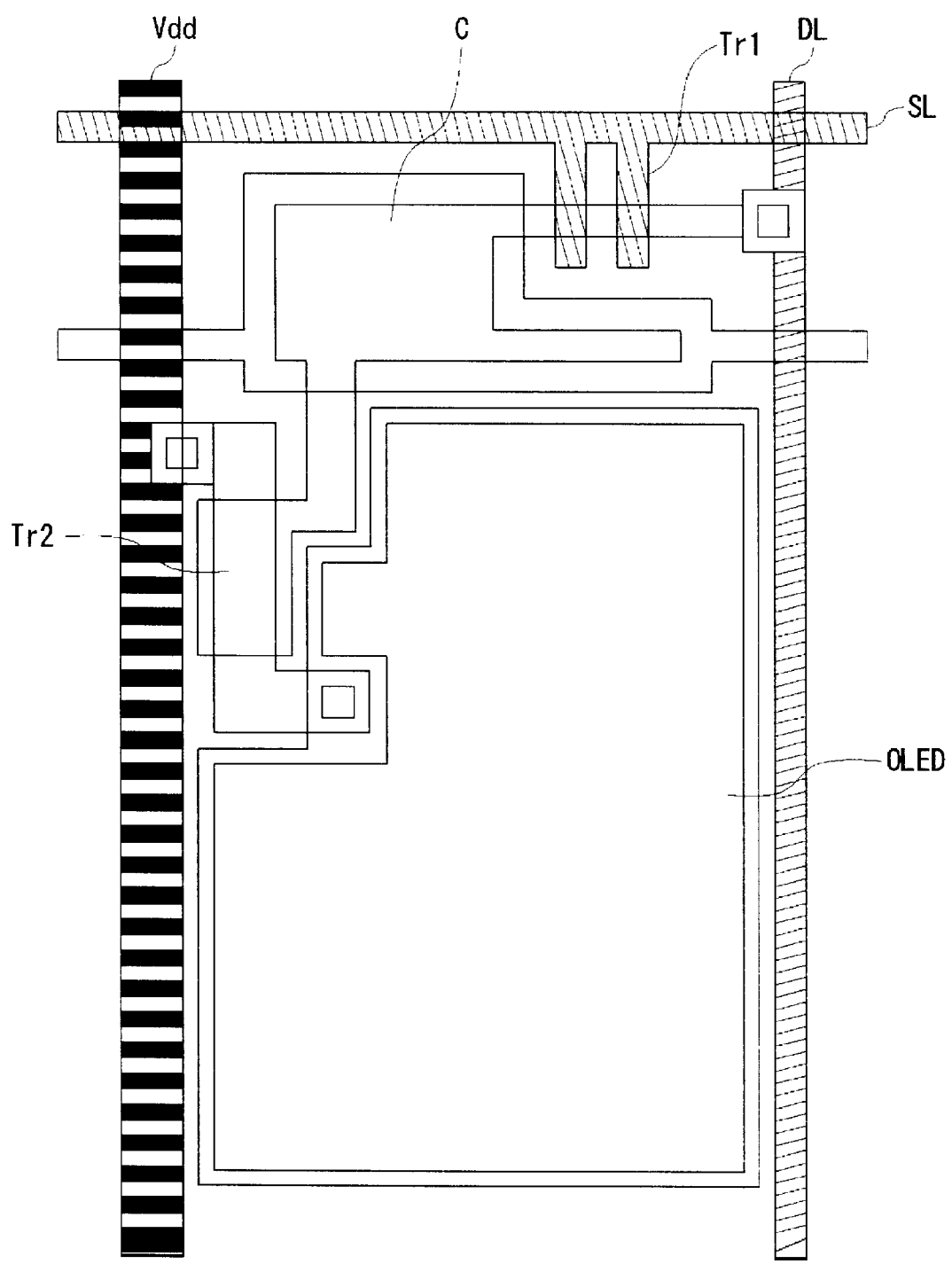
FIG. 2 schematically shows the top view of the display apparatus according to the embodiment.

FIG. 2 schematically shows a top view of the display apparatus 100 according to the embodiment. FIG. 2 shows the top view of the circuit of a single pixel as shown in FIG. 1. As shown in FIG. 2, the width of the power supply line Vdd is wider than the width of the data line DL and the width of the scanning line SL in this embodiment. The cross section of the power supply line Vdd is enlarged by widening the width of the line, so that the resistance can be lowered and the decrease of the luminance caused by the voltage drop can be reduced. The data line DL and the scanning line SL are provided for transmitting the voltage signal to the transistors of each pixel, so that the current flowing through the data line DL or the scanning line SL is transitive, not steady, and the influence of the voltage drop is small. Thereby, the aperture area of the organic light emitting element OLED can be enlarged by making the width of these lines narrower than the width of the power supply line Vdd.

Second Embodiment

Figure 3:
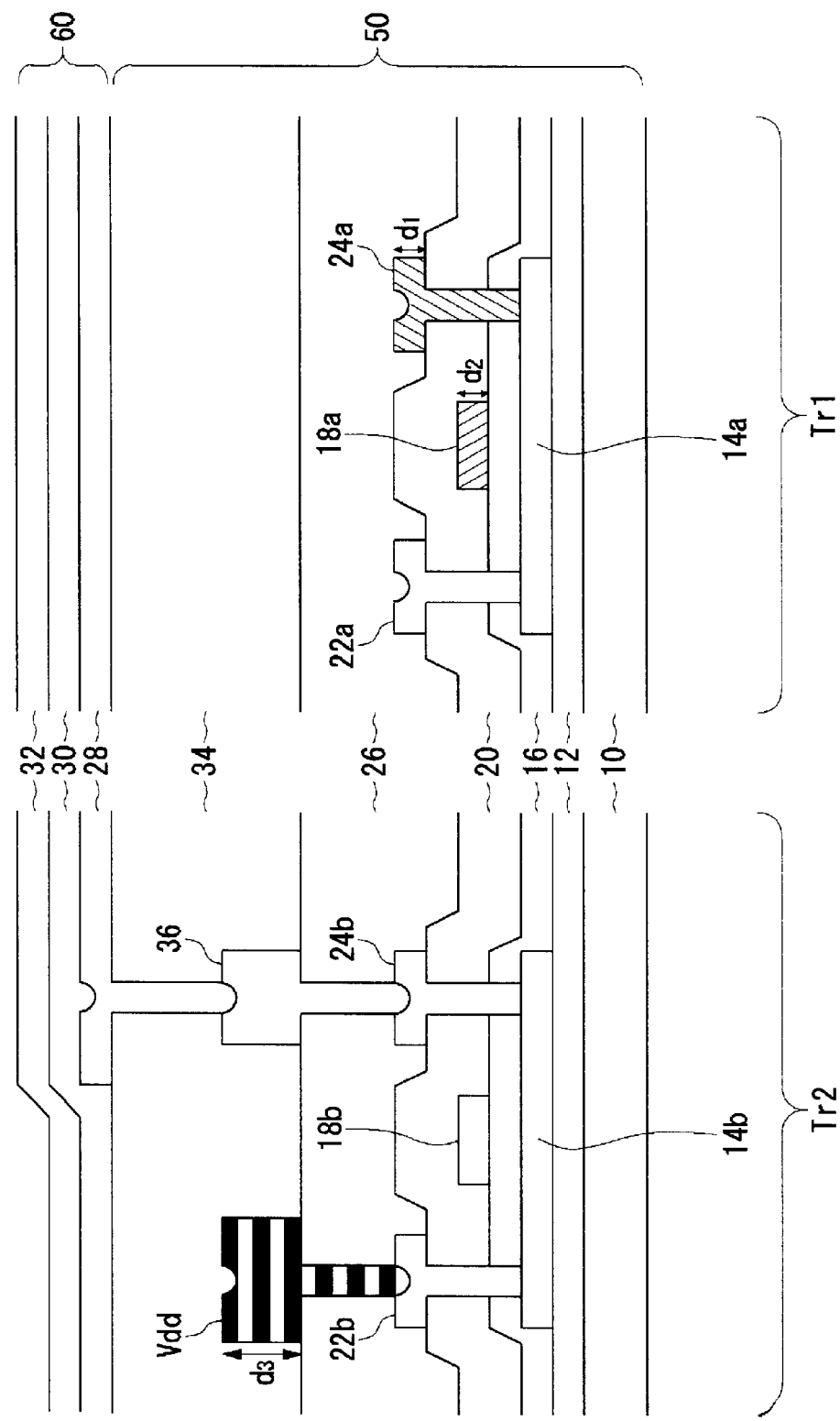
FIG. 3 schematically shows the sectional structure of the display apparatus according to the embodiment.

FIG. 3 schematically shows the sectional structure of the display apparatus 100 according to the embodiment. FIG. 3 shows the sectional structure of a part where the switching transistor Tr1, the driving transistor Tr2, and the organic light emitting element OLED are formed among the circuit of the single pixel shown in FIG. 1. The circuit structure of the display apparatus 100 according to this embodiment may be the same as the circuit structure of the first embodiment shown in FIG. 1 and FIG. 2, or may be any arbitrary structure. The display apparatus 100 comprises a TFT substrate 50 including an insulating layer 12, an active layer 14, a gate insulating layer 16, a gate electrode 18, an interlayer insulating layer 20, a drain electrode 22, a source electrode 24, a first planarization layer 26, and a second planarization layer 34, formed on a insulating substrate 10, and an organic light emitting device 60 including a pixel electrode 28, a light emitting element layer 30, and a counter electrode 32.

A method of manufacturing this display apparatus 100 is described hereinbelow. The substrate 10 may be a substrate formed by such material as quartz, glass, no-alkali glass, glass ceramic, silicone, metal or plastic. The insulating layer 12 is formed by laminating silicone oxide $SiO_2$, silicon nitride SiN, silicon oxide nitride $SiO_xN_y$, or like material on the substrate 10, using a plasma CVD or like method. The insulating layer 12 is provided for avoiding the infiltration of impurity ions such as sodium ions from the substrate 10 into the active layer 14, in the case when the substrate 10 is made of glass or like material. The insulating layer 12 may not be provided, in the case when there is not a possibility of the infiltration of impurity ions from the substrate 10.

An amorphous silicon (hereinafter also referred to as "a-Si") film is formed on the insulating layer 12 using a plasma CVD or like method, and then the a-Si film is annealed by spot irradiation by XeCl excimer laser on the surface thereof, thus melting and recrystallizing the a-Si film into a poly-silicon (hereinafter also referred to as "p-Si") film. The p-Si film is then etched into an island to form the active layers 14a and 14b.

The gate insulating layer 16 is formed by laminating silicone oxide $SiO_2$, silicon nitride SiN or like material on the whole surface of the active layers 14a and 14b, using a plasma CVD or like method. A film of conductive material which comprises a refractory metal such as chromium (Cr) or molybdenum (Mo) is formed by sputtering on the gate insulating layer 16 and then the gate electrodes 18a and 18b are formed in positions just above the active layers 14a and 14b, using photolithography and dry etching technique. At this time, a line for setting luminance data on the gate electrode 18b is formed simultaneously. The scanning line SL which is connected to the gate electrode 18a of the switching transistor Tr1 may be formed on the same layer as the gate electrode 18a. In this case, the thickness of the scanning line SL is d2.

Then N-type or P-type ions are implanted into the active layers 14a and 14b, which are p-Si films, through the gate insulating layer 16, using the gate electrodes 18a and 18b as masks. N-type or P-type impurity ions are doped into the active layers 14a and 14b excluding a part of the active layers 14a and 14b not covered with the gate electrodes 18a and 18b. The type of the impurity ion may be selected based on the type of the transistor to be formed. Parts of the active layers 14a and 14b beneath the gate electrodes 18a and 18b remain intrinsic or substantially intrinsic p-Si films.

Moreover, resists whose widths are narrower than the widths of the active layers 14a and 14b, for covering the gate electrodes 18a and 18b and the gate insulating layer 16, are formed. The ions are then implanted using the resists as masks. The parts of the active layers 14a and 14b not covered with the resists are highly doped with the impurity ions, to be source areas and drain areas. The parts of the active layers 14a and 14b covered with the resists are low doped with the impurity ions, to be LDD areas.

After removing the resists, the interlayer insulating layer 20 is formed by laminating silicone oxide $SiO_2$, silicon nitride SiN or like material on the whole surface, using a plasma CVD. Then contact holes penetrating the interlayer insulating layer 20 and reaching the active layer 14a or 14b are formed in positions corresponding to the source area and the drain area, and the source electrodes 24a and 24b and the drain electrodes 22a and 22b are formed by filling these contact holes with a metal such as aluminum (Al). At this time, lines (not shown) connected to the drain electrodes 22a and 22b and the source electrodes 24a and 24b are formed simultaneously. The data line DL which is connected to the source electrode (or the drain electrode) 24a of the switching transistor Tr1 may be formed on the same layer as the source electrode (or the drain electrode) 24a. In this case, the thickness of the data line DL is d1.

Thereafter, the first planarization layer 26 is formed thereon by depositing an organic resin or like material. This first planarization layer 26 planarizes the surface of the substrate by covering the part where the circuit such as the transistor is formed. This planarization of the surface of the TFT substrate 50, before forming the organic light emitting device 60, is very important for preventing poor luminescence of the organic light emitting device 60.

Contact holes penetrating the first planarization layer 26 and reaching the drain electrode (or the source electrode) 22b and the source electrode (or the drain electrode) 24b are formed in positions corresponding to the electrodes 22b and 24b, and the power supply line Vdd and the contact member 36 for contact with the pixel electrode 28 are formed by depositing a conductive material such as a metal thereon, and patterning the deposited material. The resistance of the power supply line Vdd can be lowered by making the thickness d3 of the power supply line Vdd thicker than the thickness d1 of the data line DL and the thickness d2 of the scanning line SL, and making the cross section of the power supply line Vdd larger. The cross section of the power supply line Vdd can be enlarged without reducing the section of the pixel aperture, by thickening the thickness of the power supply line Vdd. It becomes easier to make the thickness of the power supply line Vdd thicker than that of other lines by providing the power supply line Vdd on different layer from the data line DL and the scanning line SL. In the case that the power supply line Vdd is provided on the same layer as the data line DL or the scanning line SL, the width of the power supply line Vdd may be widening, or the power supply line Vdd and the data line DL or the scanning line SL may be formed with the predetermined thickness each by different process, or the data line DL or the scanning line SL may be thinned by etching after forming the data line DL or the scanning line SL and the power supply line Vdd by the same process. The resistance of the power supply line Vdd can be lowered and the influence of the voltage drop can be reduced, by making the cross section of the power supply line Vdd larger than that of the data line DL or the scanning line SL with any method described above. The width of the power supply line Vdd may be made wider than the width of the data line DL or the scanning line SL to enlarge furthermore the cross section as described in the first embodiment.

The second planarization layer 34 is formed on the first planarization layer 26 by depositing an organic resin or like material. A contact hole penetrating the second planarization layer 34 and reaching the contact member 36 is formed in position corresponding to the contact member 36, and the pixel electrode 28 is formed by depositing transparent electrode material such as indium tin oxide (ITO) thereon, and patterning the deposited material. The pixel electrode is an anode in this embodiment. The anode is made of such material as indium tin oxide (ITO), tin oxide ($SnO_2$), or indium oxide ($In_2O_3$). ITO is typically used because of its hole injection efficiency and low surface resistance.

A light emitting element layer 30 is formed on the pixel electrode 28. The light emitting element layer 30 may include a light emitting layer containing an organic luminescent material, and may further include a hole transporting layer and an electron transporting layer thereon or thereunder. In general, these organic layers are formed by vacuum evaporation in a multi-chamber type fabrication system having a plurality of formation chambers. The light emitting layer is made of such material as aluminum-quinoline complex (Alq3) or bis(10-hydroxybenzo[h]quinolinato) beryllium (Bebq2) containing a quinarcridon derivative. The hole transporting layer is made of such material as N,N'-di(naphthalene-1-yl)-N,N'-diphenyl-benzidine, 4,4',4"-tris(3-methylphenylphenylamino)triphenylamine(MTDATA), or N,N'-diphenyl-N,N'-di(3-methylphenyl)-1,1'-biphenyl-4,4'-diamine. The electron transporting layer is made of such material as Alq3 or Bebq2.

A counter electrode 32 is formed on the light emitting element layer 30. The counter electrode is a cathode in this embodiment. The cathode is made of such material as an aluminum alloy containing a trace quantity of lithium, a magnesium indium alloy, or a magnesium silver alloy. The counter electrode 32 may have a double-layer structure having a lithium fluoride (LiF) layer and an aluminum (Al) layer in this order from the electron transporting layer. Thus, the display apparatus 100 according to the embodiment is manufactured by the method described above.

Third Embodiment

In this embodiment, the resistance of the power supply line Vdd is lowered by making the resistivity of the constitutional material of the power supply line Vdd lower than the resistivity of the constitutional material of the data line DL or the scanning line SL. The circuit structure and the operation of the display apparatus 100 according to this embodiment is similar to the circuit structure of the display apparatus according to the first embodiment shown in FIG. 1. The manufacturing method of the display apparatus 100 according to this embodiment is similar to the manufacturing method explained in the second embodiment referring to FIG. 3. In this embodiment, the power supply line Vdd is made of aluminum, the data line DL is made of aluminum-neodymium alloy, and the scanning line SL is made of molybdenum.

The resistivity of aluminum at 20 degrees Celsius is 2.69 $\mu\Omega$cm. The resistivity of molybdenum at 20 degrees Celsius is 5.7 $\mu\Omega$cm. The resistivity of aluminum-neodymium alloy differs dependent on the content of the neodymium, but is on the whole higher than the resistivity of aluminum. Thus, the resistance of the power supply line Vdd can be made lower than the resistance of the data line DL and the scanning line SL, by wiring each line of the display apparatus 100 with above mentioned material.

The data line DL is made of aluminum-neodymium alloy in the light of improving the electromigration in this embodiment. In another embodiment, other metal, alloy, or compound may be used such as aluminum, aluminum-titanium alloy, aluminum-copper alloy, or aluminum-silicon-alloy to wire the data line DL. The scanning line SL is made of molybdenum in the light of improving the whiskers and hillocks in this embodiment. In another embodiment, other refractory metal such as chromium or titanium, or compound such as molybdenum-silicon, titanium-silicon, or tungsten-silicon may be used to wire the scanning line SL. It is preferable that the resistivity of the constitutional material of the power supply line Vdd is low, more preferably, is lower than the resistivity of the constitutional material of the data line DL or the scanning line SL. For example, the power supply line Vdd may be made of metal such as silver, copper, gold, or alloy, compound, or may have a multi-layer structure.

The resistance of the power supply line Vdd can be lowered and the influence of the voltage drop can be reduced by constituting the power supply line Vdd with low resistivity material in this embodiment as described above. The resistance of the power supply line Vdd may be further lowered by enlarging the cross section of the power supply line Vdd, by widening the width of the power supply line Vdd as described in the first embodiment, or thickening the thickness of the layer including the power supply line Vdd as described in the second embodiment, or combination of them.

The present invention has been described based on embodiments which are only exemplary. It will be understood by those skilled in the art that there exist other various modifications to the combination of each component and process described above and that such modifications are encompassed by the scope of the present invention. Such modifications will be described hereinbelow.

The layer wiring the power supply line Vdd, the data line DL, and the scanning line SL is not limited above example. They may be wired in arbitrary layers.

In the foregoing embodiment, the driving transistor Tr2 is a top-gate type transistor in which the gate electrode 18 exists above the active layer 14. Nevertheless, the driving transistor Tr2 may be a bottom-gate type transistor in which the gate electrode 18 exists below the active layer 14.

In the foregoing embodiment, the example of the organic light emitting device is explained, nevertheless the light emitting device may be an inorganic light emitting device or the liquid crystal display device. In the foregoing embodiment, the electrode of the driving transistor Tr2 is connected to the anode of the organic light emitting device, nevertheless the electrode of the driving transistor Tr2 may be connected to the cathode of the organic light emitting device.

The switching transistor Tr1 may be structured in such a manner that a plurality of transistors are connected in series. In such an arrangement, characteristics, such as current amplification factor, of the transistors may be made to differ from one another. For example, setting the current amplification factor of a transistor in the switching transistor Tr1 disposed closer to the driving transistor Tr2 to a low level may produce a marked effect of reducing leakage current. Moreover, the characteristics of the switching transistor Tr1 and the driving transistor Tr2 may be varied. For example, if the current amplification factor of the driving transistor Tr2 is made smaller, then the range of setting data corresponding to the same luminance range will be broader, thus making it easier to control the luminance.

Although the present invention has been described by way of exemplary embodiments, it should be understood that many changes and substitutions may further be made by those skilled in the art without departing from the scope of the present invention which is defined by the appended claims.

What is claimed is:

1. A display apparatus, comprising:
   a plurality of optical elements;
   a power supply line which supplies electrical energy to each of said optical elements; and
   a signal line which transmits a control signal to each of said optical elements,
   wherein a resistance of said power supply line is lower than a resistance of said signal line.

2. A display apparatus according to claim 1, wherein a cross section of said power supply line is larger than a cross section of said signal line.

3. A display apparatus according to claim 1, wherein a width of said power supply line is wider than a width of said signal line.

4. A display apparatus according to claim 2, wherein a width of said power supply line is wider than a width of said signal line.

5. A display apparatus according to claim 1, wherein a thickness of said power supply line is thicker than a thickness of said signal line.

6. A display apparatus according to claim 2, wherein a thickness of said power supply line is thicker than a thickness of said signal line.

7. A display apparatus according to claim 3, wherein a thickness of said power supply line is thicker than a thickness of said signal line.

8. A display apparatus according to claim 4, wherein a thickness of said power supply line is thicker than a thickness of said signal line.

9. A display apparatus according to claim 1, wherein a resistivity of a constitutional material of said power supply line is lower than a resistivity of a constitutional material of said signal line.

10. A display apparatus according to claim 2, wherein a resistivity of a constitutional material of said power supply line is lower than a resistivity of a constitutional material of said signal line.

11. A display apparatus according to claim 3, wherein a resistivity of a constitutional material of said power supply line is lower than a resistivity of a constitutional material of said signal line.

12. A display apparatus according to claim 4, wherein a resistivity of a constitutional material of said power supply line is lower than a resistivity of a constitutional material of said signal line.

13. A display apparatus according to claim 5, wherein a resistivity of a constitutional material of said power supply line is lower than a resistivity of a constitutional material of said signal line.

14. A display apparatus according to claim 6, wherein a resistivity of a constitutional material of said power supply line is lower than a resistivity of a constitutional material of said signal line.

15. A display apparatus according to claim 7, wherein a resistivity of a constitutional material of said power supply line is lower than a resistivity of a constitutional material of said signal line.

16. A display apparatus according to claim 8, wherein a resistivity of a constitutional material of said power supply line is lower than a resistivity of a constitutional material of said signal line.

17. A display apparatus according to claim 1, wherein said signal line is a data line which transmits luminance data for controlling each of said optical elements.

18. A display apparatus according to claim 2, wherein said signal line is a data line which transmits luminance data for controlling each of said optical elements.

19. A display apparatus according to claim 1, wherein said signal line is a scanning line which transmits a scan signal for controlling a display timing of each of said optical elements.

20. A display apparatus according to claim 2, wherein said signal line is a scanning line which transmits a scan signal for controlling a display timing of each of said optical elements.

* * * * *